United States Patent [19]

Godbey et al.

[11] Patent Number: 5,205,871
[45] Date of Patent: Apr. 27, 1993

[54] MONOCRYSTALLINE GERMANIUM FILM ON SAPPHIRE

[75] Inventors: David J. Godbey, Bethesda, Md.; Syed B. Qadri, Alexandria, Va.

[73] Assignee: The United States of America as represented by the Secretary of the Navy, Washington, D.C.

[21] Appl. No.: 531,720

[22] Filed: Jun. 1, 1990

[51] Int. Cl.$^5$ .............................................. H01L 29/12
[52] U.S. Cl. .................................... 148/33.3; 156/612; 437/126; 148/DIG. 58
[58] Field of Search .... 148/33.3, DIG. 58, DIG. 150, 148/33.4, 33.5; 156/612; 437/126, 132, 131

[56] References Cited

U.S. PATENT DOCUMENTS

| | | | |
|---|---|---|---|
| 3,753,775 | 8/1973 | Robinson et al. | 156/612 |
| 4,529,455 | 7/1985 | Bean et al. | 437/131 |
| 5,091,333 | 2/1992 | Fan et al. | 437/132 |

OTHER PUBLICATIONS

D. J. Dumin "Growth and Properties of Thin Germanium Films" J. Electrochem. Soc.: Solid State Science vol. 117, No. 1, pp. 95–100, Jan. 1970.
D. J. Godbey, et al "Single-crystal germanium grown on ($1\bar{1}02$) sapphire by molecular beam epitaxy" Appl. Phys. Lett. 54(24), 12 Jun. 1989 pp. 2449–2451.
D. J. Godbey, et al "MBE-Grown Germanium on Sapphire ($1\bar{1}02$)" Thin Solid Films, 184 (1990) pp. 379–386.
R. F. Tramposch, "Epitaxial Films of Germanium Deposited on Sapphire via Chemical Vapor Transport" J. Electrochem. Soc. & Solid State Science vol. 116, No. 5 pp. 654–658 (1969).
R. F. Tramposch, "Heteroepitaxial Films of Germanium on Sapphire" Applied Physics Letters vol. 9, No. 2, 15 Jul. 1966, pp. 83–84.

Primary Examiner—Brian E. Hearn
Assistant Examiner—Linda J. Fleck
Attorney, Agent, or Firm—Thomas E. McDonnell; Barry A. Edelberg

[57] ABSTRACT

A monocrystalline germanium film is grown on a sapphire substrate with a ($1\bar{1}02$) orientation. The substrate is first pretreated to restructure the ($1\bar{1}02$) surface plane. Typically, restructuring is accomplished by either an anneal at high temperature or ion bombardment. A monocrystalline germanium layer is grown on the pretreated surface by a vapor deposition process such as molecular beam epitaxy or chemical vapor deposition.

22 Claims, No Drawings

MONOCRYSTALLINE GERMANIUM FILM ON SAPPHIRE

BACKGROUND OF THE INVENTION

1. Field of the Invention

The present invention relates in general to a semiconductor on insulator material and process of making same and, more particularly, to a monocrystalline germanium film on an α-alumina substrate.

2. Description of the Prior Art

Semiconductor on insulator technology is used for complementary circuits and applications where a high density of devices is used and latch up needs to be controlled. Some of these materials also show good resistance to radiation. To date, most of the semiconductor on insulator technology is based on silicon coatings on a sapphire substrate (SOS). For example, U.S. Pat. No. 4,442,178 describes a process of forming a silicon layer with an index plane of (100) on a single crystal sapphire substrate with an index of plane ($\bar{1}$102). U.S. Pat. No. 3,589,936 discloses the growth of single crystal germanium of (111) orientation on the basal (0001) plane of a sapphire substrate.

Germanium is known to grow on sapphire using chemical vapor deposition, chemical reactions, and recrystallization techniques. However, the limitations incurred in these methods are severe, since the growth of single crystal germanium on sapphire has been unsuccessful without the incorporation of substantial amounts of dopants. For example, U.S. Pat. No. 3,589,936 discloses growing crystalline germanium on the sapphire basal (0001) plane, only when the source germanium was heavily doped with arsenic or phosphorous.

U.S. Pat. No. 3,433,684 discloses a process of forming a germanium film by chemical vapor deposition on a sapphire substrate by heating the substrate to between 500°-800° C. and flowing GeH$_4$ over the substrate. The (111) plane of the germanium is deposited on the basal plane of the sapphire substrate. However, the basal plane of sapphire is not generally used in the SOS technology. Consequently, it is desirable to have a process of depositing monocrystalline germanium on the ($\bar{1}$102) plane of sapphire, which, in the case of analogous silicon on sapphire films, is used in high radiation resistant circuits.

It is desirable to have the ability to produce an undoped single crystalline germanium film on a sapphire substrate due to the sometimes desirable electrical properties of the undoped monocrystalline germanium. It is also desirable to have a process in which doped or undoped monocrystalline germanium (110 plane) can be formed on the commercially more important r-plane [or ($\bar{1}$102)] of α-alumina substrate such as sapphire.

SUMMARY OF THE INVENTION

These and other objects are accomplished by depositing germanium from vapor phase onto the ($\bar{1}$102) plane (r-plane) of an α-alumina substrate which has been pretreated to prepare the substrate for epitaxial growth by restructuring the r-plane surface thereof.

DESCRIPTION OF THE PREFERRED EMBODIMENTS

A doped or undoped monocrystalline germanium film is grown on the r-plane of an α-alumina (single crystal sapphire) substrate which has been restructured by pretreatment. Typically, pretreatment is accomplished either by annealing the substrate at a high temperature (above about 1100° C.) or by ion bombardment with a noble gas. Apparently, sapphire substrate preparation (cutting, etc) and/or polishing procedures inherently produce defects in the r-plane surface which are detrimental to, and thus substantially prevent, the epitaxial growth of germanium thereon. Although it is not desired to be bound by theory, it is believed that the present invention prepares the substrate for epitaxial growth by a restructuring which significantly reduces, and preferably essentially eliminates, these epitaxial growth inhibiting defects. It is also possible that this restructuring adds a significant other types of surface "defects" to the r-plane which enhance the epitaxial growth of germanium thereon. As defined in the present specification and claims, a restructuring of the surface and/or a reduction in epitaxial growth-inhibiting defects is "significant" if that restructuring or reduction provides renders the r-plane surface of the substrate capable of supporting the growth of a monocrystalline germanium film thereon.

If the substrate is pretreated by annealing, the anneal temperature is generally between 1100° C. and the temperature at which significant thermal activation of the substrate occurs. Typical annealing temperatures are from about 1100°-1600° C., preferably about 1300°-1500° C. and most preferably about 1350°-1450° C. Annealing is performed until the anneal is complete or essentially complete and the r-plane surface is significantly restructured. Typically, depending on the temperature, the anneal takes about 5-60 minutes, more often about 20-50 minutes and most often about 25-35 minutes. Once the substrate has completely annealed, further additional annealing time has no effect. Annealing is preferably performed in a vacuum or in a carrier gas for, such as a carrier gas typically used for chemical vapor deposition, for example hydrogen, nitrogen, or a noble gas.

If the substrate is pretreated by ion bombardment rather than annealing, the bombarding gas may be any carrier gas, but is preferably a noble gas such as argon or neon. Ion bombardment is performed, typically under standard conditions, until the r-plane of the substrate surface is significantly restructured. Preferably, the conditions and treatment time for ion bombardment are selected to remove at least about 50 to 100 Å of substrate. Treatment times and/or conditions sufficient to remove more substrate, while not detrimental to the present invention, have no noticeable effect and are therefore wasteful. Usually, under standard ion bombardment conditions, the sapphire substrate can be successfully pretreated in about 0.5 to 15 minutes.

The germanium film may be grown by any vapor phase technique such as molecular beam epitaxy (MBE) and chemical vapor deposition (CVD). Film growth occurs under standard conditions and at standard rates for the selected vapor deposition process used. Preferably, for film growth by molecular beam epitaxy, film growth occurs at higher temperatures to assure the formation of monocrystalline, rather than polycrystalline, germanium. For example, molecular beam epitaxy of germanium onto the annealed sapphire substrate is typically performed at about 600°-900° C., preferably at about 650°-850° C. and most preferably about 750° to 850° C.

The growth rate of the germanium film upon the annealed substrate is not critical to the process and is that characteristic of the selected process and conditions. For example, under the preferred MBE conditions described above, the growth rate of the germanium film will be about 0.01–1.0 nm/second, and most often about 0.01 to 0.1 nm/second. Growth in CVD process may be carried out much faster, for example 10 nm/second.

Usually, the α-alumina substrate is cleaned, prior to annealing or ion bombardment, to remove both organic and inorganic contaminants by standard cleaning procedures. For example, wafers of sapphire are first rinsed sequentially in acetone, trichloroethylene, acetone, and methanol, followed by rinsing alternately in hot $H_2O:HCl:H_2O_2$ in a weight ratio of 4:1:1, and a 5% HF solution. Other suitable organic solvents and acid solutions can be used to remove the organic and inorganic contaminants normally found on the surface of the α-alumina substrates.

In another embodiment, a silicon or gallium arsenide or Group III-V metal may be deposited on the monocrystalline germanium film using conventional techniques. Also, these layers may be sequentially deposited on the monocrystalline germanium film. Such articles have utility as semiconductor devices in electronic circuitry.

Typically, germanium films grown on the r-plane of single crystal sapphire have plane and perpendicular lattice parameters of 5.657 Å. Nevertheless, in thin germanium films, the lattice parameters may be strained, resulting in slightly different lattice parameters.

Without further elaboration, it is believed that one skilled in the art can, using the preceding description, utilize the present invention to its fullest extent. The following preferred specific embodiments are, therefore, to be construed as merely illustrative and not limitative of the remainder of the disclosure in any way whatsoever.

In the foregoing and in the following example, all temperatures are set forth uncorrected in degrees Celsius; and, unless otherwise indicated, all parts and percentages are by weight.

The entire disclosures of all applications, patents and publications, cited above and below, are hereby incorporated by reference.

EXAMPLES

Sapphire ($1\bar{1}02$) wafer substrates were rinsed sequentially in acetone, trichlorethylene, acetone and methanol, followed by rinsing alternately in hot $H_2O:HCl:H_2O_2$, 4:1:1, and a 5% HF solution. The wafers were loaded in a Vacuum Generators V80 MBE system equipped with high purity germanium loaded in a Temescal single hearth electron gun evaporation source. The preannealed sapphire wafers are then preannealed between 1100° and 1400° C. followed by the growth of the germanium films. The growth temperatures ranged from 400° to 800° C., the growth rate was about 1 Å/s, and the film thicknesses attained were between 400 and 1000 nm.

The grown films were characterized using X-ray diffraction. A series of Read photographs was taken as a function of film growth temperature. All of the films shown were preannealed at 1400° C. The film grown at 400° C. had a highly reflective mirror-like finish, but the continuous arcs in its read photograph indicate that the germanium is polycrystalline. The remainder of the spots result from diffraction from the sapphire substrate. As the growth temperature was increased, the degree of polycrystallinity of the grown films decreased, as shown by Read photographs. At a growth temperature of 700° C. or above, spots were observed in the Read photos instead of arcs indicating that germanium had a definite preferred orientation. The orientation of films grown according to the present invention was determined by X-ray diffraction. a$\Theta$/2$\Theta$ scan of the film grown at 800° C., only the (220) and the (440) reflections of germanium occurred, indicating that growth was along the [110] direction. This is in contrast to the (100) orientation that silicon displays when grown on sapphire ($1\bar{1}02$).

X-ray measurements were also made from reflecting planes perpendicular to the plane of the substrate. The wafer was cut along the ($\bar{1}012$) plane of sapphire so that reflections could be observed from the ($\bar{1}11$) plane of germanium and ($10\bar{1}2$) plane of sapphire. A cut made perpendicular to the first permitted the measurement of the reflections from the ($\bar{2}2\bar{4}$) plane of germanium, and the ($01\bar{1}2$) plane of the sapphire. This implies a misfit of 6.3% when comparing the interplanar spacings between ($\bar{1}11$) germanium and ($\bar{1}012$) sapphire, and a 0.45% misfit between ($\bar{2}2\bar{4}$) germanium and ($03\bar{3}6$) sapphire. Both the in-plane and perpendicular lattice parameters of germanium were measured to be 5.657 Å, indicating that no significant tetragonal distortion was present.

Transmission electron microscopy (TEM) observations were used to verify the orientational relationship [i.e., ($\bar{1}11$)/($\bar{1}012$); ($\bar{2}2\bar{4}$)/($01\bar{1}2$)] between germanium and sapphire that was determined by X-ray diffraction. The presence of a second minor orientation was detected in the thinner films that is symmetrically related to the (110) orientation described above, via the ($\bar{1}1\bar{2}0$) mirror plane of sapphire [i.e., ($\bar{1}10$/($01\bar{1}2$); ($2\bar{2}4$)/($\bar{1}012$)]. A small fraction of germanium also assumed the twinned orientations corresponding to the germanium orientations present. Although two orientations were detected in the thinner films by TEM, a single orientation was found to dominate in the germanium films, and X-ray measurements using an oscillating sample (Weissenberg) failed to detect the presence of a second orientation.

The quality of the films was further examined by measuring X-ray rocking curves for the (220) germanium reflections. The full width at half maximum (FWHM) for this film was 317 arcsec. The thickness of this film was 500 nm, but the width of the X-ray line was narrower than the line measured for a 900 nm film grown at 700° C., as shown in Table 1. The use of higher temperatures according to the present invention are important in growing films because of the increased diffusion rate of germanium across the sapphire surface, and to overcome the activation barrier of germanium nucleation that is necessary for epitaxial deposition to occur.

TABLE 1

| Film/substrate | $T_{growth}$ | $T_{preanneal}$ | Thickness | FWHM (arcsec) |
|---|---|---|---|---|
| Ge/Al$_2$O$_3$ | 800 | 1400 | 450 | 317 |
| Ge/Al$_2$O$_3$ | 700 | 1400 | 900 | 400 |
| Ge/Al$_2$O$_3$ | 700 | 1100 | 900 | 575 |
| Si/Al$_2$O$_3$ | unknown | unknown | 390 | 1200 |
| Si/Al$_2$O$_3$ | 1000 | — | 630 | 950 |

Table I also shows that the preanneal temperature is important, because for two GOS films grown at 700° C., the film grown on sapphire preannealed to 1400° C.

generated a narrower rocking curve (400 arcsec) than the film grown on sapphire preannealed only to 1100° C. (575 arcsec). Although the precise reasons for this behavior is not entirely understood, one possible explanation for this behavior is that during high temperature annealing, the sapphire surface undergoes restructuring, resulting in a reduction of epitaxial growth-inhibiting surface defects and/or perhaps the generation of other types of surface aberrations which enhance the epitaxial growth of germanium thereon. In addition, the removal of contaminants, such as carbon, from the sapphire surface by high temperature treatments, and perhaps even preferential removal of oxygen, may be responsible, at least in part, for the results obtained according to the present invention.

In comparing GOS films prepared according to the present invention to silicon on sapphire films, it was found that the FWHM of the diffraction peak from the GOS films is significantly narrower than the diffraction peaks of several representative SOS films described in the films discussed in T. Vreeland, J. Mater. Res. 1, 712 (1986), K. W. Carey, J. Cryst. Growth, 58, 1 (1982).

Some of the potential applications for the use of GOS include the development of electronic devices based on germanium where an insulating substrate is necessary. GOS can also provide a useful substrate on which to grow gallium arsenide, since the lattice match between germanium and gallium is so close.

The preceding examples can be repeated with similar success by substituting the generically or specifically described reactants and/or operating conditions of this invention for those used in the preceding examples.

Further details and information concerning the present invention may be found in Godbey et al, Appl. Phys. Lett., 54(12), June 12, 1989 pp. 2449-2451, and in Thin Solid Films, 184, pp 379-386, both of which are incorporated herein by reference.

From the foregoing description, one skilled in the art can easily ascertain the essential characteristics of this invention, and without departing from the spirit and scope thereof, can make various changes and modifications of the invention to adapt it to various usages and conditions.

What is claimed is:

1. A germanium on sapphire substrate for a semiconductor device, comprising:
   a single crystal sapphire substrate which has a surface with an index of plane (1$\bar{1}$02); and
   an epitaxial monocrystalline germanium layer on said surface of the sapphire substrate.

2. The germanium on sapphire substrate of claim 1, wherein said
   epitaxial monocrystalline germanium layer has a surface with an index of plane (110).

3. The germanium on sapphire substrate of claim 1, wherein there is no significant tetragonal distortion in the plane and perpendicular lattices of the germanium layer.

4. The germanium on sapphire substrate of claim 1, further comprising a silicon layer on the germanium layer.

5. The germanium on sapphire substrate of claim 1, further comprising a gallium arsenide layer on the germanium layer.

6. The geranium on saphire substrate of claim 1, further comprising sequentially deposited layers of gallium arsenide and silicon on the germanium layer.

7. A process for the production of a monocrystalline germanium layer on the r-plane of an α- alumina substrate, comprising the steps of:
   pretreating said α-alumina substrate to significantly restructure said r-plane surface thus rendering said r-plane surface capable of supporting the epitaxial growth of germanium thereon;
   vapor depositing a monocrystalline layer of germanium on said r-plane of said pretreated substrate.

8. The process of claim 7, wherein said pretreating step comprises annealing or ion bombardment.

9. The process of claim 8, wherein said pretreating step comprises annealing the α-alumina substrate at a temperature of from about 1100°-1600° C.

10. The process of claim 9, wherein said substrate is annealed under vacuum or in the presence of a carrier gas.

11. The process of claim 9, wherein said substrate is annealed for about 5 to 60 minutes.

12. The process of claim 9, wherein the substrate is annealed at a temperature of from about 1300°-1500° C.

13. The process of claim 9, wherein the substrate is annealed at a temperature of from about 1350°-1450° C.

14. The process of claim 7, wherein said substrate is cleaned prior to said pretreatment.

15. The process of claim 7, wherein the α-alumina is single crystal sapphire.

16. The process of 7, wherein said vapor depositing step comprises molecular beam epitaxy or chemical vapor deposition.

17. The process of claim 16, wherein the germanium layer is grown by molecular beam epitaxy.

18. The process of claim 17, wherein the germanium layer is grown at a temperature of about 600°-900° C.

19. The process of claim 18, wherein the germanium layer is grown at a temperature of about 650°-850° C.

20. The process of claim 9, wherein the germanium layer is grown at a temperature of about 750°-850° C.

21. The process of claim 7, wherein the α-alumina substrate is subjected to ion bombardment prior to growing germanium thereon.

22. The process of claim 21, wherein the α-alumina substrate is subjected to ion bombardment with a noble gas during the annealing.

* * * * *